(12) United States Patent
Ishida

(10) Patent No.: US 6,201,422 B1
(45) Date of Patent: Mar. 13, 2001

(54) STATE MACHINE, SEMICONDUCTOR DEVICE AND ELECTRONIC EQUIPMENT

(75) Inventor: Takuya Ishida, Sapporo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/355,242

(22) PCT Filed: Dec. 1, 1998

(86) PCT No.: PCT/JP98/05413
§ 371 Date: Oct. 13, 1999
§ 102(e) Date: Oct. 13, 1999

(87) PCT Pub. No.: WO99/29041
PCT Pub. Date: Oct. 6, 1999

(30) Foreign Application Priority Data

Dec. 1, 1997 (JP) .................................................. 9-329991

(51) Int. Cl.$^7$ ....................................................... H03L 7/00

(52) U.S. Cl. .......................... 327/141; 327/154; 327/212

(58) Field of Search ..................................... 327/141, 154, 327/160–163, 291, 293, 295, 296, 298, 91, 93, 97, 199, 211, 212, 216, 218

(56) References Cited

FOREIGN PATENT DOCUMENTS

| 60-235525 | 11/1985 | (JP) . |
| 5-284002 | 10/1993 | (JP) . |

*Primary Examiner*—Toan Tran
(74) *Attorney, Agent, or Firm*—Oliff & Berridge

(57) ABSTRACT

A state machine operates in synchronization with a reference clock signal (110) to switch between n numbers of states and maintain any one of these states. Every time a condition for transition to each of the n numbers of states is satisfied, a signal output circuit (100) makes one of n numbers of transition condition satisfying signals (111W, 111Z, 111Y . . . ) active and outputs it. One of a plurality of D-type flip-flops (101-1, 101-2, 101-k . . . ) makes active any one of nu numbers of state signals (W, Z, Y . . . ) indicating the corresponding n numbers of states, and holds the corresponding one state. A synchronization pulse generation circuit (102) generates a one-shot synchronization pulse signal (112) in synchronization with the reference clock signal (110), when a transition condition for transition to one state is satisfied. When a one-shot synchronization pulse signal (112) is input to the D-type flip-flop (101-k) and also the condition for transition to state Y has been satisfied, the state Y is held during the period from after the establishment of the condition for transition to the state Y, until a condition for transition to another state such as W or Z is satisfied.

16 Claims, 15 Drawing Sheets

US 6,201,422 B1

STATE MACHINE, SEMICONDUCTOR DEVICE AND ELECTRONIC EQUIPMENT

TECHNICAL FIELD

The present invention concerns a logic circuit technology and relates to a state machine operating in synchronization, a semiconductor device and electronic equipment.

BACKGROUND OF ART

A state machine has a plurality of states and transitions between these states occur when a condition for transition from one state to another state is satisfied. Most of state machines within a system, operate at timings that are synchronized with the same reference clock signal, and each state machine operates to represent only one state during the same period, while mutually exchanging signals. With a state machine that branches to at least two states depending on conditions, particularly during a transition from a certain state to another state, it is customary to have one flip-flop for one state, in order to prevent any static hazard in the circuitry that forms the state machine.

A state machine without branches is equivalent to a binary counter, and it decodes states held in k numbers of flip-flops to create a number of states n that is greater than k, without causing any static hazard, in a manner similar to a well-known Gray code counter. In a circuit designed to be completely synchronous, states hazard is no problem provided that prescribed conditions are satisfied, such as the state signals of the state machine are not used as trigger signals for other circuits. In such a case, the states of k numbers of flip-flops can be decoded to create n numbers of states, where n is a larger number than k.

An example of a state transition diagram of a state machine, given in FIGS. 14 to 6 of the ISO/IEC8802-3 Standard, has been simplified and is shown as FIG. 12 herein. When a transition condition is satisfied, this state machine acquires any one of state from five states 401 to 406, via transitions 410 to 420. For example, the condition that causes the transition 412 is "link_loss_timer_done*RD=idle*link_test_rcv=false", in accordance with the standard. When that condition is satisfied when the current state is the state 401, the transition 412 is executed to switch to the state 402.

A partial extract of the state transition diagram of the state machine is shown in FIG. 13, centered on a state Y and showing only transitions to that state and transitions from that state. An example of a configuration by which the state Y is set by one flip-flop is shown in FIG. 14.

FIG. 14 shown an example in which each state is set by a single D-type flip-flop (hereinafter abbreviated to D-type F.F.). The state Y can be obtained at a Q output terminal of a D-type F.F. 501-k by inputting to a C input terminal thereof a reference clock signal 110 via a buffer 503 and inputting to a D input terminal thereof a signal that is raised by a condition of "switch to state Y and maintain that state Y". In other words, the transition to the state Y occurs when the condition "state P×condition a+state Q×condition b" occurs (see FIG. 13). In addition, to maintain the state Y when the state is currently Y, the condition is "state Y×(−condition c) (−condition d)", according to FIG. 13. The sum of a condition (transition condition) 111Y for transition to the state Y and a condition (holding condition) 612Y for holding the state Y is obtained by an OR gate 502-k and is input to the D input terminal of the D-type F.F. 501-k. The transition condition 111Y and the holding condition 612Y are obtained by using AND gates 504 to 507 shown in FIG. 15.

Operating waveforms of the state machine of FIG. 14 are shown in FIG. 16. The reference clock signal 110 is generated throughout all operating periods and the transition condition 111Y for transition to the state Y becomes true at a time a. At this point, either the condition a is satisfied within the state P or the condition b is satisfied within the state Q. Since the transition condition 111Y is modified by a certain delay with respect to the timing of the system clock, the state Y becomes true at a time b, which is the time of the next clock. Subsequently, a transition condition 111W for transition to the state W becomes true at a time c. At this point, a condition d is satisfied within the state Y. The holding condition 612Y for the state Y remains active in the state Y while there is no condition for the transition from the state Y. In other words, the holding condition 612Y is held true by ensuring that neither the condition c nor the condition d is satisfied during the period from the time b to the time c. The operation of the holding condition 612Y is similar to that when a condition for transition from the state Y to a sate Z is satisfied, by satisfying the condition c when in the state Y, at the time c. The state Y is made false at a time d by the transition condition 612Y going false at the time c.

An example of a configuration in which one state is set by one JK-type flip-flop (hereinafter abbreviated to JK-type F.F.) is shown in FIG. 17. The state Y can be obtained at a Q output terminal of a JK-type F.F. 521-k by inputting the reference clock signal 110 to a C input terminal thereof, the transition condition 111Y for transition to the state Y to a first input terminal thereof, and the transition condition 212Y for transition to another state from the state Y to a second input terminal thereof. The transition condition 111Y for transition to the state Y is equivalent to that for a D-type F.F., and the transition condition 212Y for transition to another state from the state Y is "state Y×condition c+state Y×condition d", according to FIG. 13. The transition condition 111Y and the transition condition 212Y are obtained by AND gates 522 to 525 and OR gates 526 and 527, as shown in FIG. 18.

Operational waveforms of the state machine of FIG. 16 are shown in FIG. 19. The transition condition 111Y for transition to the state Y becomes true at the time a. At this point, either the condition a is satisfied within the state P or the condition b is satisfied within the state Q. This makes the state Y true at the time b. The transition condition from the state Y subsequently becomes true at the time c. At this point, either the condition c is satisfied within the state Y, or the condition d is satisfied. This makes the state Y become false at the time d.

In accordance with these conventional techniques, a large number of state machines which configure the system must be operated simultaneously at the clock timing required by the system, which raises a problem in that the power consumption increases. Any increase in the number of state machines and the number of state machine's states necessitates increased number of components, and the clock is need to be driven by a corresponding amount. In addition, in order to drive the clocks of a large number of flip-flops simultaneously, a buffer component having a large drive capability is necessary. The power consumption problem is dramatic in a system in which state transition conditions occur at a far longer separation than the reference clock, such as a state machine for a link integrity test as set by the ISO/IEC8802-3 Standard and shown in FIG. 12.

In the state machine of FIG. 12, transition conditions satisfy frequently, on the order of microseconds to seconds with respect to the reference clock signal of 10 MHz. In that case, driving all of the flip-flops at the 10 MHz of the reference clock signal means that power losses are great when they are not operating.

In addition, the conventional technique necessitates that the conditions for transition to the various states and either the conditions for maintaining those states or conditions for transition to another state from those states are input the flip-flops representing the states of the state machine. This makes the state machine more complicated and necessitates a large number of circuit components. A transition condition to a certain state is also a transition condition from another state, and signals indicating similar conditions can be used in a complicated fashion to indicate other states. As a result, the redundancy of the circuitry increases, which makes the circuitry more complicated and is a factor in increasing the number of debugging and maintenance steps.

An objective of the present invention is to provide a state machine, a semiconductor device, and electronic equipment using the same, which enable a reduction in power consumption.

Another objective of the present invention is to provide a state machine, a semiconductor device, and electronic equipment using the same, which enable a reduction in circuit redundancy, simplify the circuitry accordingly, and which also enable a reduction in the number of debugging and maintenance steps therefor.

DISCLOSURE OF THE INVENTION

An aspect of the present invention relates to a state machine operating in synchronization with a reference clock signal and holding any one state that shifts between n numbers of states, the state machine comprising:

signal output means for activating and outputting any one of n numbers of transition condition satisfying signals, every time a condition for transition to any of the n numbers of states is satisfied;

n numbers of state holding means provided in correspondence to the n number of states, for outputting n numbers of state signals representing the corresponding n numbers of states, any one of the n numbers of state signals being activated so as to hold one of the n numbers of states; and synchronization pulse signal generation means for generating a one-shot synchronization pulse signal which synchronizes with the reference clock signal, when the condition for transition to any one of the states is satisfied, wherein the one-shot synchronization pulse signal is input in common to all of the n numbers of state holding means, and any one of the state holding means corresponding to any one the states for which a transition condition is satisfied makes corresponding one of the state signals active, during a period from the satisfaction of the condition for transition to one of the states until the satisfaction of a condition for transition to another one of the states.

With this aspect of the invention, the input terminals of the n numbers of state holding means are driven only at the times at which the one-shot synchronization pulse signal is input in common; at all times they are not driven at all. It is clear that the component that is always driven in synchronization with the reference clock signal during this time is an input terminal of the synchronization pulse signal generation means. It is therefore clear that the power consumed in the device of this aspect of the invention is markedly lower than that of a conventional device which operates at all of the timing synchronized with the reference clock signal. Moreover, since circuit redundancy can be reduced because it is not necessary to input holding conditions, the circuitry is simplified and the effect of reducing the number of debugging and maintenance steps can be achieved.

Within this aspect of the invention, the n numbers of state holding means may be configured of first to nth D-type flip-flops. In that case, the n numbers of transition condition satisfying signals may be input to the data input terminal of the corresponding first to nth D-type flip-flop. In addition, the synchronization pulse signal that is generated by the synchronization pulse signal generation means may be input to the clock input terminals of all these first to nth D-type flip-flops. First to nth state signals may be output from data output terminals of the corresponding first to nth D-type flip-flops.

With such a configuration, it is clear that only transition condition satisfying signals for transition to each state are input to the n numbers of D-type flip-flops, and holding conditions are not necessary. It is therefore clear that the size of circuitry necessary for the device of the present invention is markedly smaller than that of the conventional device of FIG. 14.

With this aspect of the invention, the n numbers of state holding means may be configured of first to nth JK-type flip-flops. In that case, the n numbers of transition condition satisfying signals may be input to the first input terminal of the corresponding first to nth JK-type flip-flop. In addition, signals any one of which is made active by satisfying a condition for transition to another state from any one of the first to nth states may be input to second input terminals of the first to nth JK-type flip-flops. Similarly, the synchronization pulse signal that is generated by the synchronization pulse signal generation means may be input to the clock input terminals of all these first to nth JK-type flip-flops. First to nth state signals are output from data output terminals of the corresponding first to nth JK-type flip-flops.

With such a configuration, the n numbers of JK-type flip-flops that hold the respective states are the same as in the conventional device of FIG. 18 in that it is necessary to have transition condition satisfying signals for transition to each state and transition conditions for transition from each state, but they make it possible to achieve a markedly lower power consumption than that of the conventional device of FIG. 18 in that the JK-type flip-flops are not driven constantly based on the reference clock signal.

Another aspect of the present invention relates to a state machine operating in synchronization with a reference clock signal and holding any one state that shifts between n numbers of states, the state machine comprising:

signal output means for outputting k numbers of (where k<n) first to kth combined transition-condition satisfying signals corresponding to the n numbers of states, every time there is a change in conditions for transition to any of the n numbers of states;

synchronization pulse signal generation means for generating a one-shot synchronization pulse signal which synchronizes with the reference clock signal, when the condition for transition to one of the states is satisfied;

k numbers of state code holder means for outputting first to kth state code signals corresponding to the first to kth combined transition-condition satisfying signals, based on the first to kth combined transition-condition satisfying signals and the one-shot synchronization pulse signal; and decoding means for decoding the first to kth state code signals that are output from the k numbers of state code holder means and generating n means of state signals corresponding in a one-to-one manner to the n numbers of states.

This aspect of the present invention can be applied to a device in which state code signals from k numbers of state code holder means configured of flip-flops or the like are decoded to generate n numbers of state signals (where n>k). In this case too, it is possible to achieve a markedly lower power consumption than in the conventional device, because the all of the k numbers of state code holder means are not driven constantly based on the reference clock signal.

The synchronization pulse signal generation means of the present invention may comprise a D-type flip-flop and an AND circuit. A signal that is made active by any of the first to kth transition condition satisfying signals may be input to a data input terminal of the D-type flip-flop and an inverted signal of the reference clock signal is input to a clock input terminal thereof. By inputting a data output of the D-type flip-flop and the reference clock signal to the AND circuit, a one-shot synchronization pulse signal may be output from this AND circuit every time a transition condition is satisfied.

The present invention may be provided with state-monitoring means for detecting an abnormality by monitoring the n numbers of states and detecting an abnormality that is indicated by at least two states being true. After detecting an abnormality, this state-monitoring means resets the abnormal state and causes the state machine to return to a prescribed state other than the abnormal state, such as an initial state.

A further aspect of the present invention relates to a semiconductor device operating in synchronization with a reference clock signal, such that a state of a signal in an (m+1)th operating cycle is determined based on a state of a signal within an mth operating cycle, wherein the semiconductor device comprises n numbers of state machines and at least one state machine has the configuration described above.

Electronic equipment in accordance with a still further aspect of the present invention comprises the above-described semiconductor device.

BEST MODE FOR CARRYING OUT THE INVENTION

First Embodiment

Figure 1:
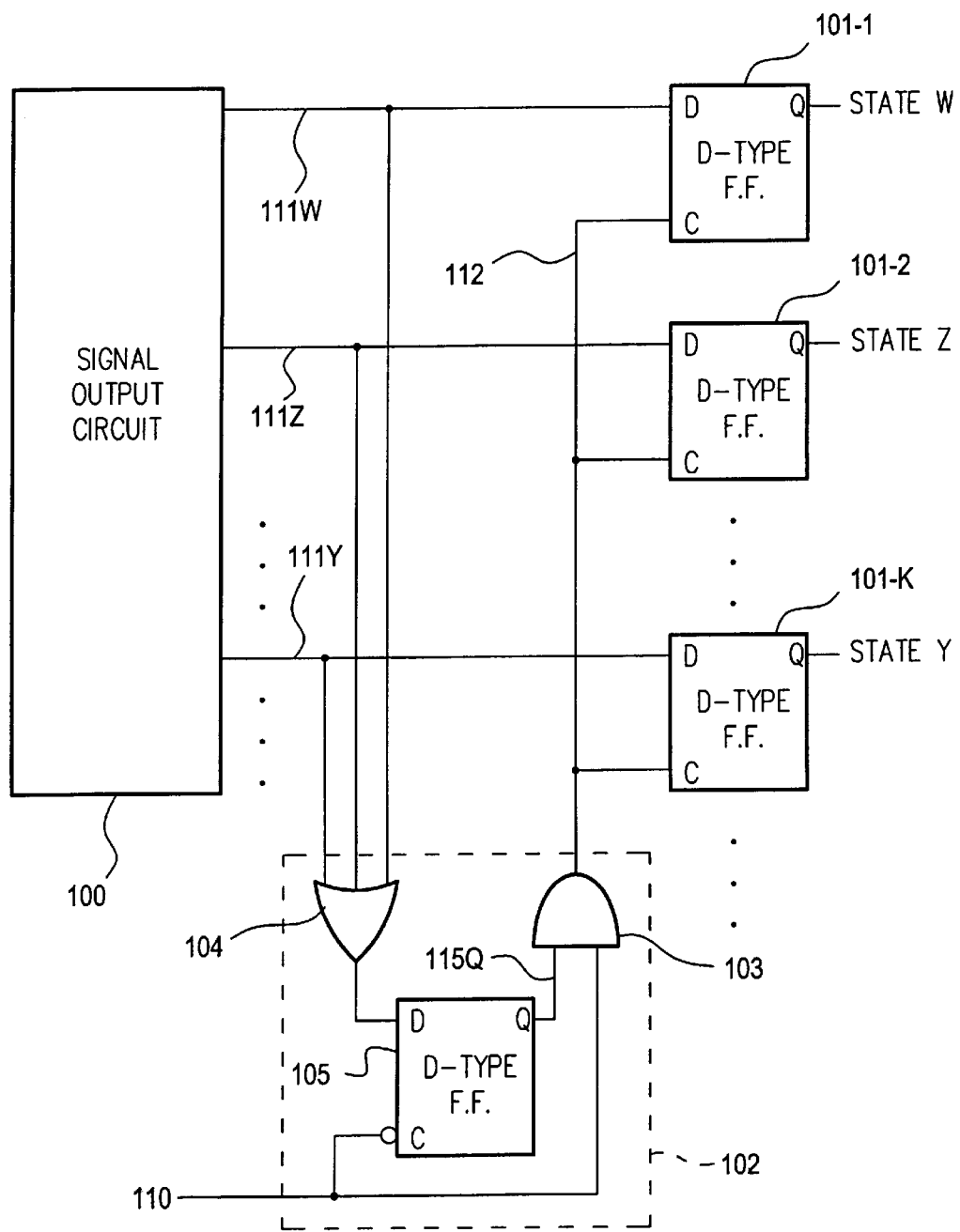
FIG. 1 is a circuit diagram of a first embodiment of a state machine in accordance with the present invention.
Figure 13:
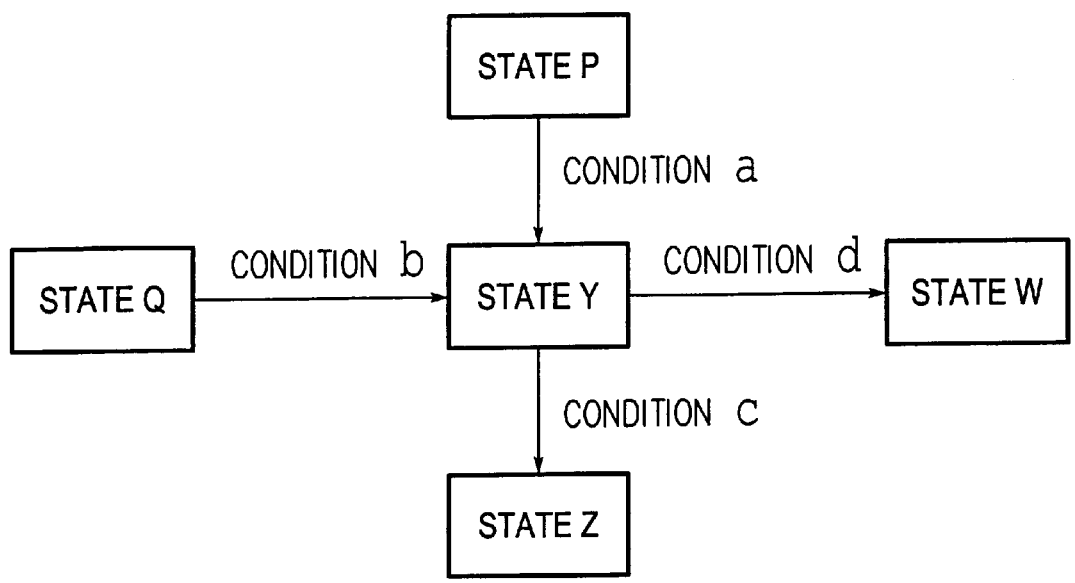
FIG. 13 shows another example of state transitions.
Figure 14:
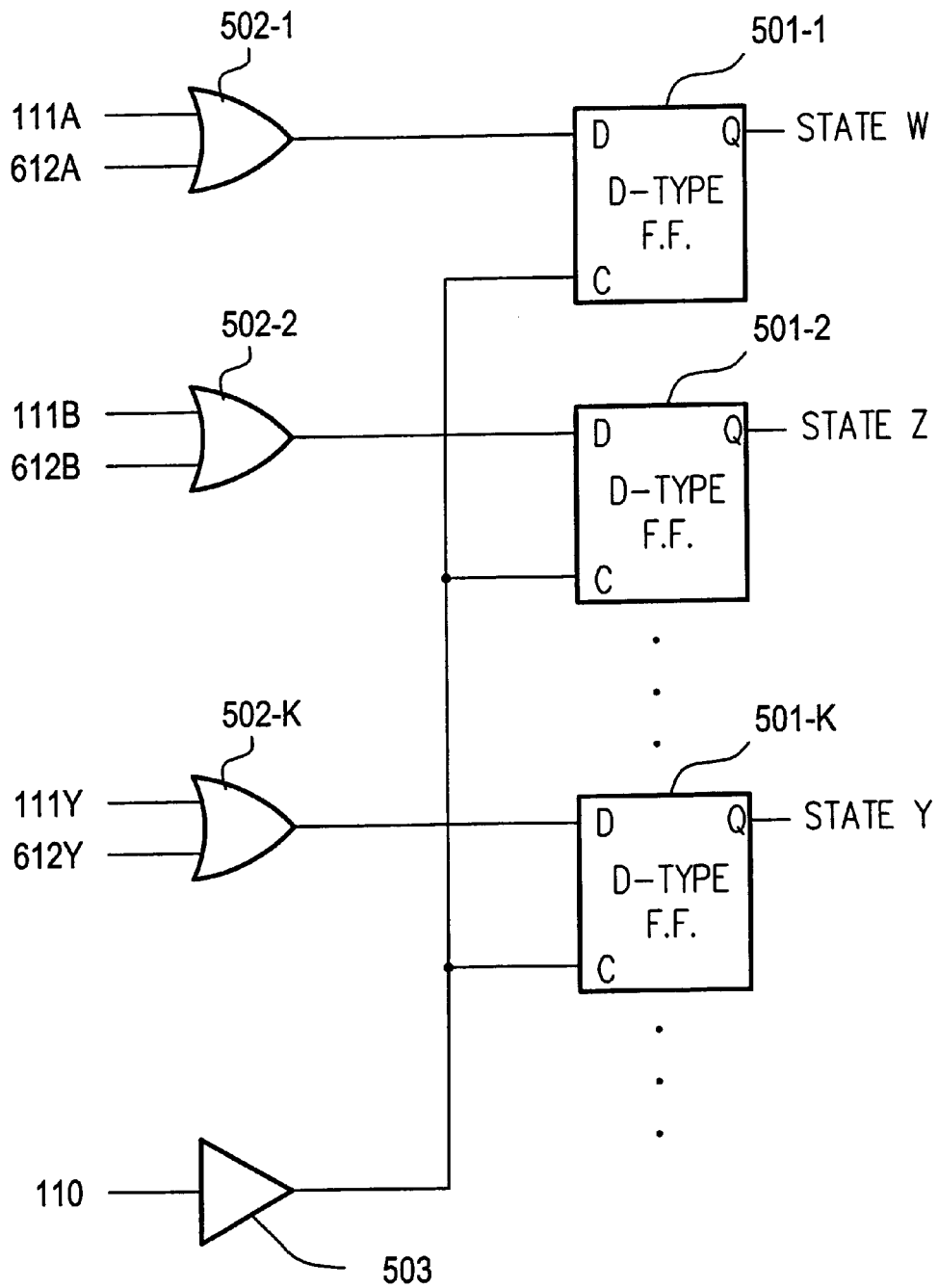
FIG. 14 is a circuit diagram of a conventional state machine.
Figure 15:
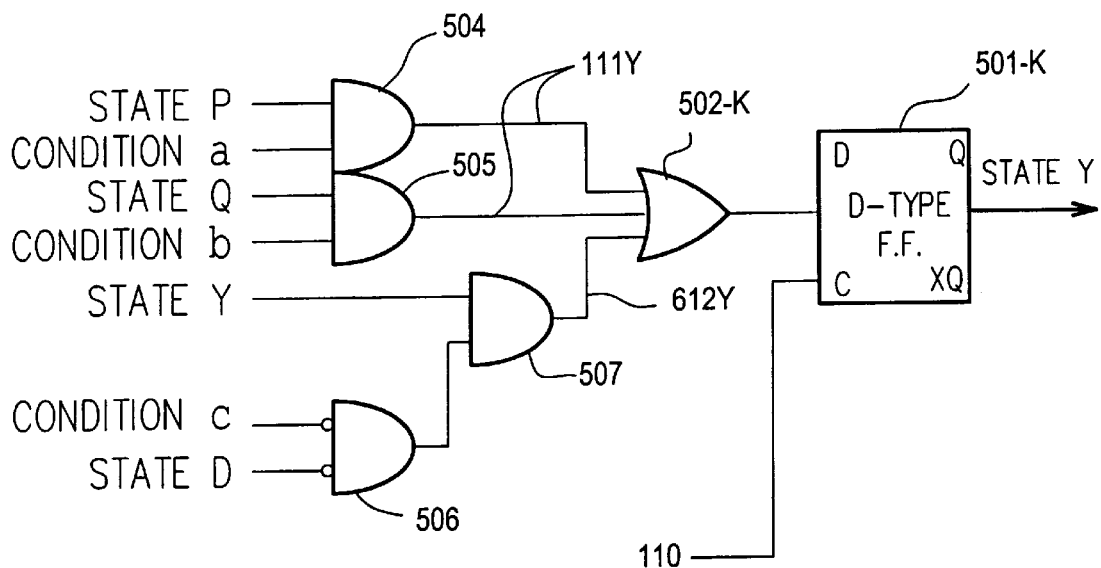
FIG. 15 is a circuit diagram of the logic circuit that generates the transition conditions and holding conditions of FIG. 14.
Figure 16:
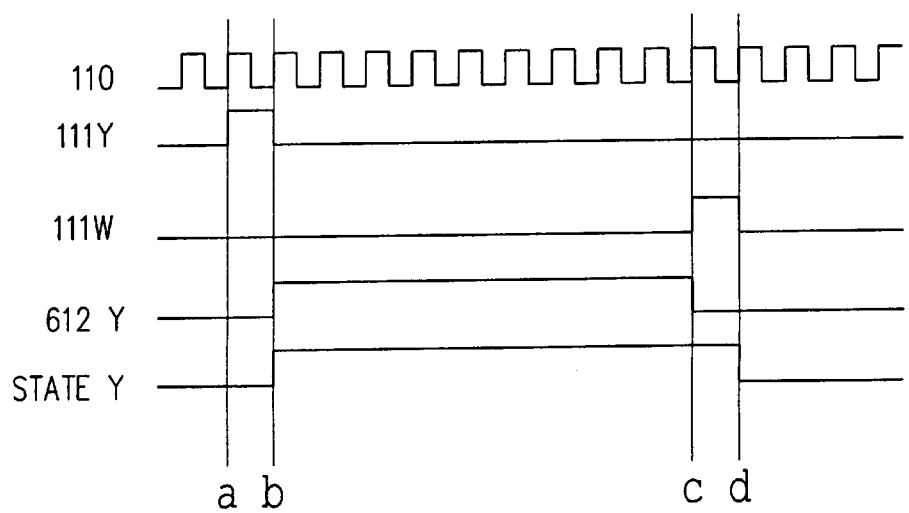
FIG. 16 is an operational waveform chart of the state machine of FIG. 14.
Figure 17:
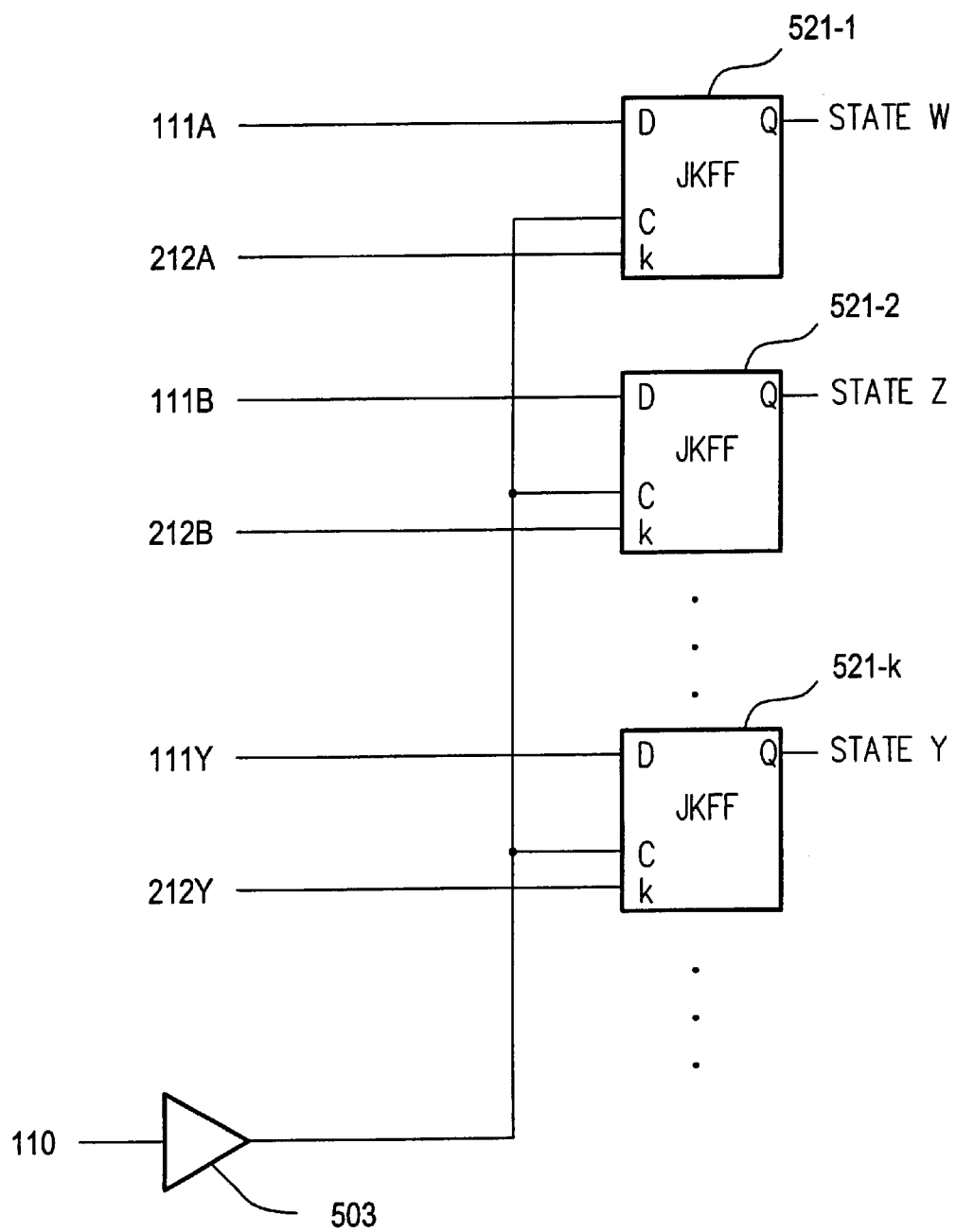
FIG. 17 is a circuit diagram of another conventional state machine.
Figure 18:
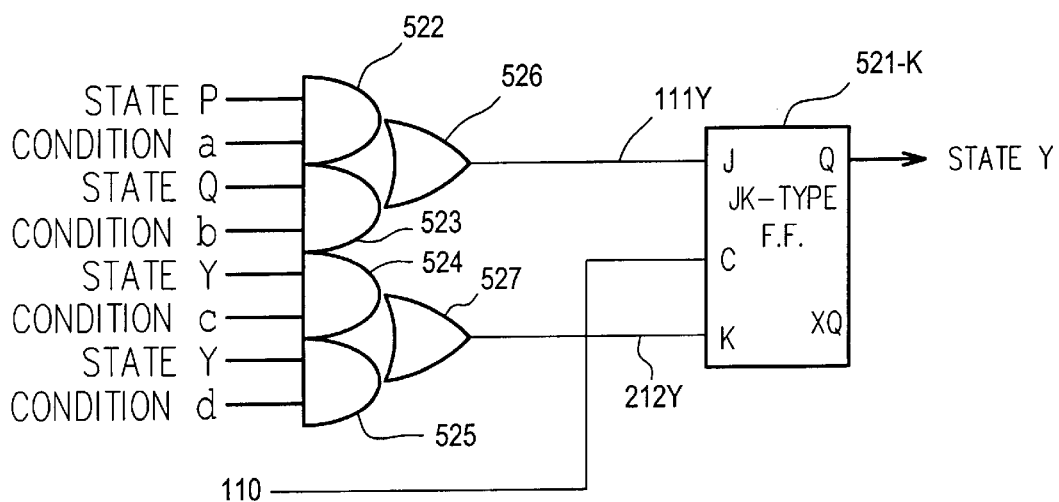
FIG. 18 is a circuit diagram of the logic circuit that generates the transition conditions and holding conditions of FIG. 17.
Figure 19:
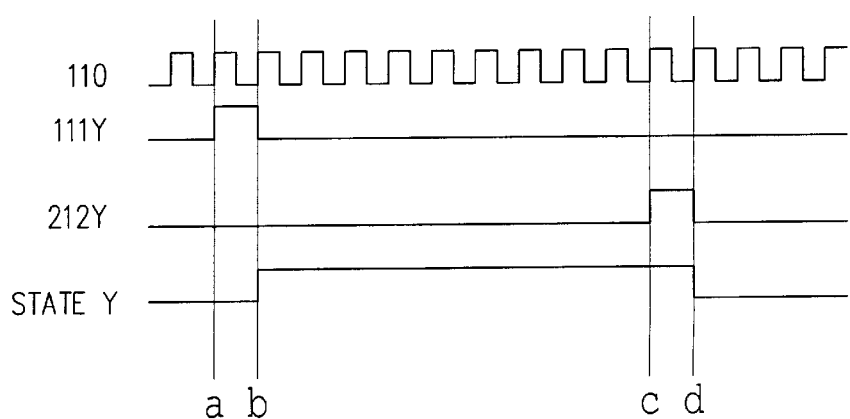
FIG. 19 is an operational waveform chart of the state machine of FIG. 17.

A first embodiment of a state machine in accordance with the present invention is shown in FIG. 1. Note that the state machine shown in FIG. 1 is set for the various states shown in FIG. 13, so that the states W, Y, and Z in FIG. 1 correspond to the states W, Y, and Z in FIG. 13.

In FIG. 1, this state machine comprises a signal output circuit 100 that outputs transition condition satisfying signals 111W, 111Z, 111Y, etc.; D-type F.Fs. 101-1, 101-2, 101-K, . . . acting as state holding means for holding each of the various states shown in FIG. 13; and a synchronization pulse generation circuit 102.

Figure 2:
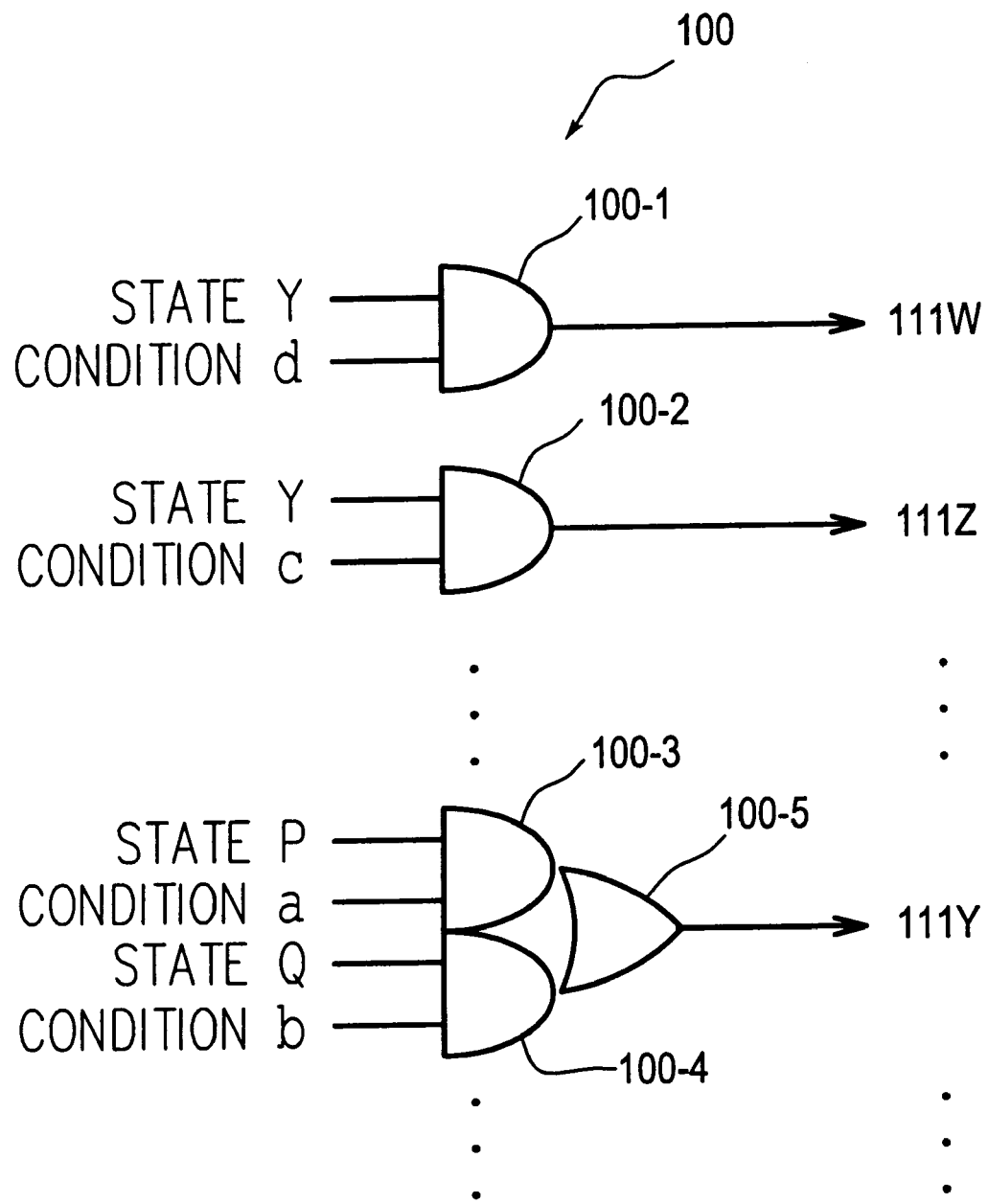
FIG. 2 is a circuit diagram of an example of the signal output circuit of FIG. 1.

An example of the signal output circuit 100 of FIG. 1 is shown in FIG. 2. As shown in FIG. 2, this signal output circuit 100 comprises AND gates 100-1 to 100-4 and an OR gate 100-5. The AND gate 100-1 makes the transition condition satisfying signal 111W go active (become 1) and outputs it when both the state Y and a condition d are 1; otherwise it makes the transition condition satisfying signal 111W be non-active (become 0). Similarly, the AND gate 100-2 makes the transition condition satisfying signal 111Z go active (become 1) and outputs it when both the state Y and a condition c are 1; otherwise it makes the transition condition satisfying signal 111Z be non-active (become 0). Furthermore, the AND gates 100-3 and 100-4 and the OR gate 101-5 make the transition condition satisfying signal 111Y go active (become 1) and outputs it when both the state P and a condition a are 1 or when both the state Q and a condition b are 1; otherwise they make the transition condition satisfying signal 111Y be non-active (become 0).

The synchronization pulse generation circuit 102 comprises an AND gate 103, an OR gate 104, and a D-type F.F. 105. All of the transition condition satisfying signals, including the previously described transition condition satisfying signals 111W, 111Z, and 111Y, are input to the OR gate 104. An inversion signal of a reference clock signal 110 is input to a C input terminal of the D-type F.F. 105 and an output of the OR gate 104 is input to a D input terminal thereof. An output signal 115Q from a Q output terminal of the D-type F.F. 105 is input to the AND gate 103 together with the reference clock signal 110.

The transition condition satisfying signals 111W, 111Z, . . . 111Y . . . are input to D input terminals (data input terminals) of the corresponding D-type F.Fs. 100-1, 100-2, . . . 100-k that act as state holder circuits whereas a synchronization pulse signal 112 that is an output of the AND gate 103 in the synchronization pulse generation circuit 102 is input in common to all the C input terminals (clock input terminals) thereof.

Figure 3:
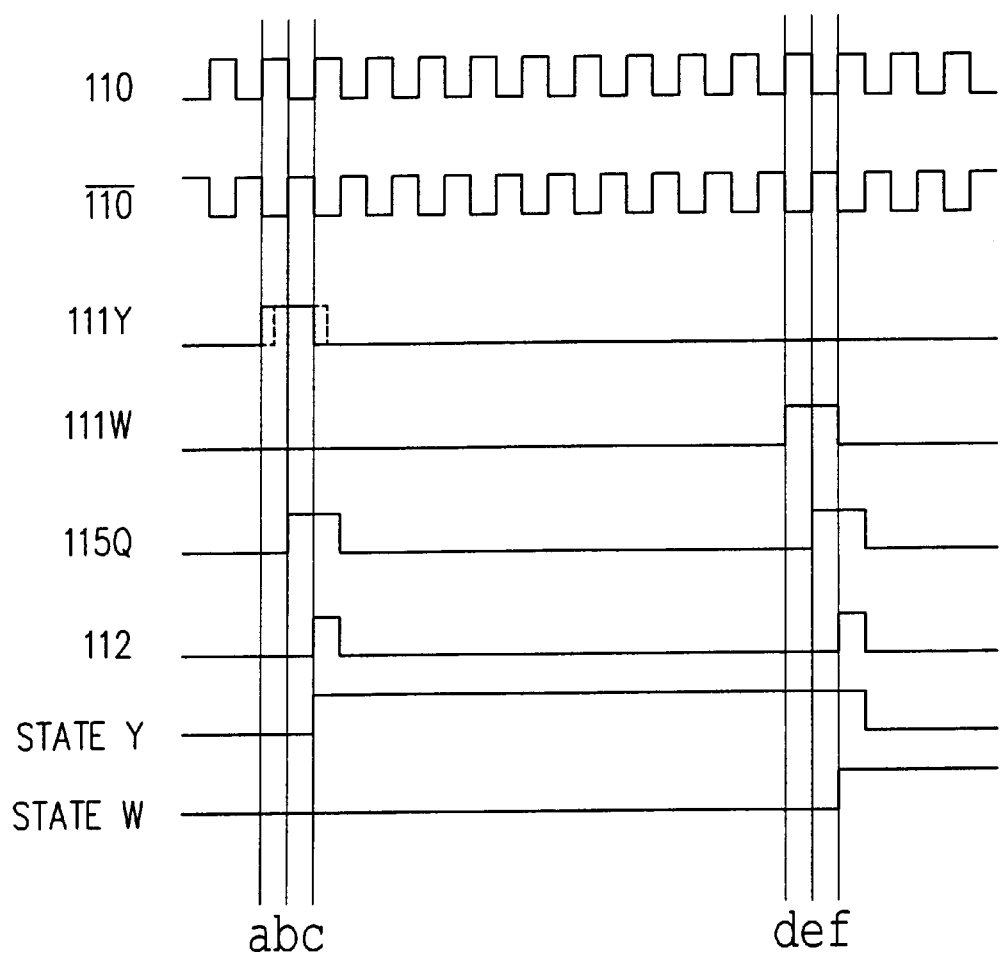
FIG. 3 is an operational waveform chart of the state machine of FIG. 1.

The operation of the state machine of FIG. 1 will now be described with reference to the timing chart of FIG. 3. FIG. 3 shows the operation of a transition from the state P or the state Q to the state Y, followed by another transition to the state W.

For a transition from the state P or the state Q to the state Y, it is necessary to make the transition condition satisfying signal 111Y of FIGS. 1 and 2 go active. The condition for making the transition condition satisfying signal 111Y go active must be to satisfy the logic condition "stage P×condition a+state Q×condition b", from FIG. 13. If this logic condition is satisfied, the transition condition satisfying signal 111Y that is output by the OR gate 100-5 of FIG. 2 becomes active between the times a and c in FIG. 3, and this active signal 111Y is input to the OR gate 104 and the D-type F.F. 100-k of FIG. 1.

At the same time, the reference clock signal 110 is output continuously throughout all the operating periods as shown in FIG. 3. In this case, when the transition condition satisfying signal 111Y becomes active at the time a in FIG. 3, "1" is input to the D input terminal of the D-type F.F. 105 through the OR gate 104 of the synchronization pulse generation circuit 102. An inverted signal of the reference clock signal 110 is input to the C input terminal of the D-type F.F. 105. Thus "1" appears at the Q output terminal (data output terminal) of the D-type F.F. 105 at a time b at which the reference clock signal 110 next falls (rise of the inverted signal thereof) after the time a (see output signal 115Q in FIG. 3).

The value at the Q output terminal of the D-type F.F. 105 is held until the reference clock signal 110 next falls (the next rise of the inverted signal thereof). This makes the synchronization pulse signal 112, which is at 1 for the width of the half-cycle of the reference clock signal 110, appear in synchronization with the reference clock signal 110 at the time c, from the AND gate 103 to which the output signal 115Q of the D-type F.F. 105 and the reference clock signal 110 are input.

In this case, the D-type F.F. 101-k, to which the activated transition condition satisfying signal 111Y is input through the D input terminal, is also inputs the synchronization pulse signal 112 through the c input terminal during the period in which the transition condition satisfying signal 111Y is active, as shown in FIG. 3. Thus a signal that makes the state Y active is output from the Q output terminal of the D-type F.F. 101-k at the time c shown in FIG. 3.

The synchronization pulse signal 112 does not become active subsequently, so long as no other transition condition satisfying signal such as the signal 111W becomes active, thus the Y state is held by the output from the Q output terminal of the D-type F.F. 101-k.

However, the transition condition satisfying signal 111Y is modified by a delay with respect to the timing of the system clock (see the broken line in FIG. 3, for example), so that the state Y becomes true at the time c only if there is enough delay to ensure a sufficiently long hold time to maintain the active state before the rise of the synchronization pulse signal 112.

Now assume in this case that the transition condition satisfying signal 111W for transition to the state W becomes true at a time d in FIG. 3. At this point, the condition d is satisfied at the state Y, and the transition condition satisfying signal 111W that is output from the AND gate 100-1 of FIG. 2 becomes active. The synchronization pulse signal 112 is generated at a time f because the transition condition satisfying signal 111W has become active, by the same operation as that which activated it at the time c. The state W becomes true at the time f in FIG. 3, by the output from the Q output terminal of the D-type F.F. 101-1 to which is input the transition condition satisfying a signal 111W at the rise of the synchronization pulse signal 112 at the time f. At this point, the transition condition satisfying signal 111Y is non-active, so the state Y is false at the time f at which the synchronization pulse signal 112 becomes active.

It can be seen that while this state machine is operating, the C input terminals of all of the D-type F.Fs. 101-1, 101-2, . . . 101-K, . . . are driven only at the time c at which the state Y is true and the time f at which the state Y is false; at all other times they are not driven at all. It is also clear that the components that are always driven in synchronization with the reference clock signal 110 during this time are the C input terminal of the D-type F.F. 105 and the single input terminal of the AND gate 103. It is therefore clear that the power consumed in the device of this aspect of the present embodiment is markedly lower than that of a conventional device in which all of the timing is in synchronization with the reference clock signal. Moreover, since circuit redundancy can be reduced because it is not necessary to input holding conditions, the circuitry is simplified and the effect of reducing the number of debugging and maintenance steps can be achieved.

Each of the D-type F.Fs. 101-1, 101-2, . . . 101-K, . . . that hold the states inputs only the transition condition satisfying signal for transition to the corresponding state, so it is clear that it is not necessary to have holding conditions or conditions for transition from each state. It is therefore clear that the size of circuitry necessary for the device of the present embodiment is markedly smaller than that of the conventional device.

Second Embodiment

Figure 4:
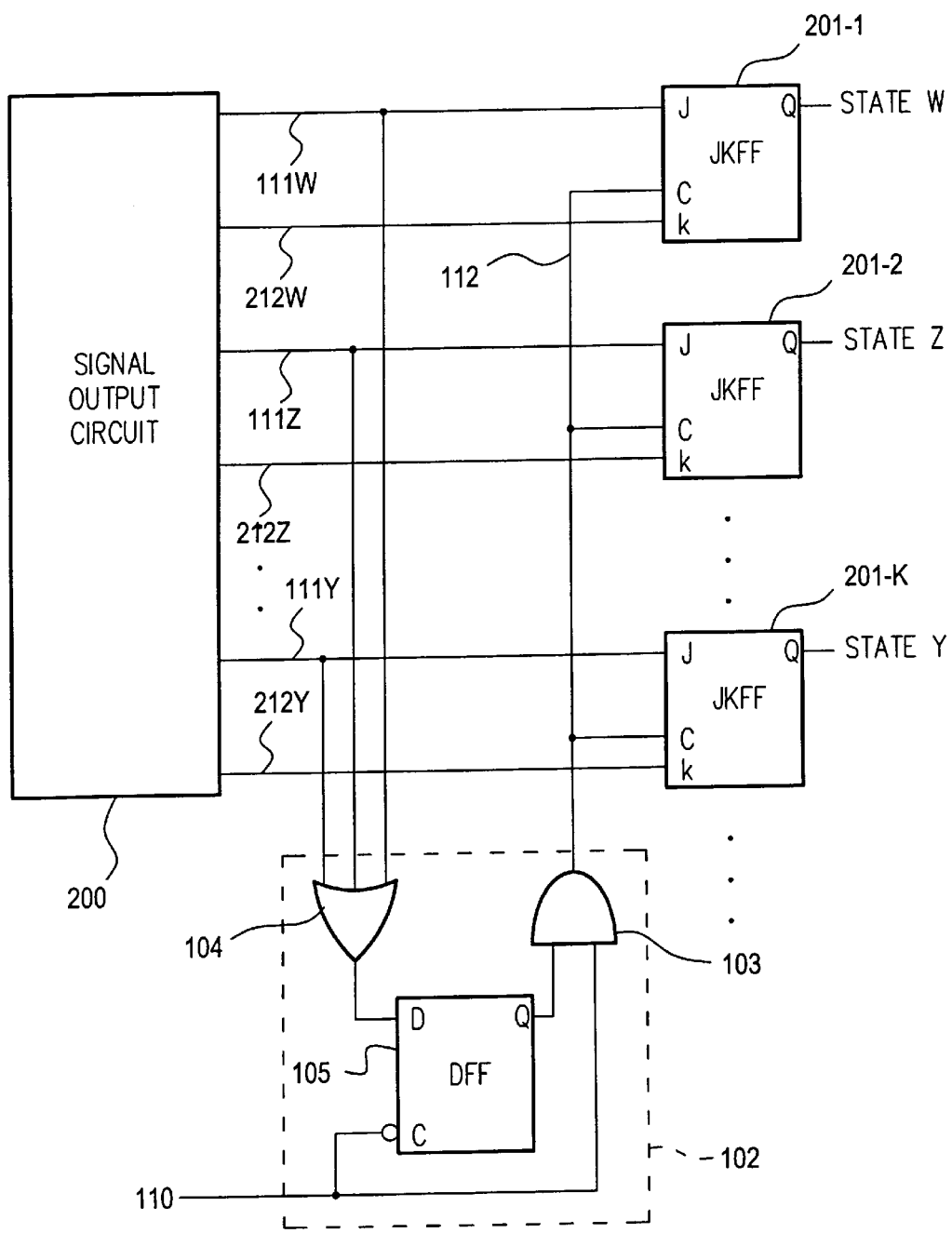
FIG. 4 is a circuit diagram of a second embodiment of a state machine in accordance with the present invention.

A block diagram of a state machine in accordance with a second embodiment of the present invention is shown in FIG. 4. The various states shown in FIG. 4 correspond to the states shown in FIG. 13, in a similar manner to the embodiment shown in FIG. 1.

Figure 5:
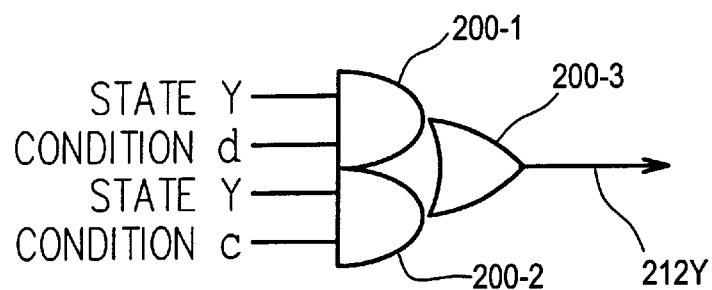
FIG. 5 is a circuit diagram of part of the configuration of the signal output circuit of FIG. 4.

The device shown in FIG. 4 differs from the device shown in FIG. 1 in that it uses JK-type F.Fs. 201-1, 201-2, . . . 201-k, . . . instead of the D-type F.Fs. 101-1, 101-2, . . . 101-K, . . . of FIG. 1 and it is configured to output further transition condition satisfying signals 212W, 212Z, . . . 212Y, . . . in addition to the transition condition satisfying signals 111W, 111Z, . . . 111Y, . . . from a signal output circuit 200. Note that each of the transition condition satisfying signals 212W, 212Z, and 212Y becomes active when a condition for transition to another state from the corresponding state W, state Z, and state Y is satisfied. Within the structure of the signal output circuit 200, the configuration for outputting the transition condition satisfying signal 212Y is as shown in FIG. 5, and comprises two AND gates 200-1 and 200-2 and one OR gate 200-3, by way of example.

The operation of the state machine of FIG. 4 will now be described with reference to the timing chart of FIG. 6.

In a similar manner to the operation of the state machine of FIG. 1, when the transition condition satisfying signal 111Y becomes active, this means that it becomes true and is input to the D input terminal of the D-type F.F. 105 through the OR gate 104 of the synchronization pulse generation circuit 102. Since an inversion of the reference clock signal 110 is being input to the C input terminal of the D-type F.F.

Figure 6:
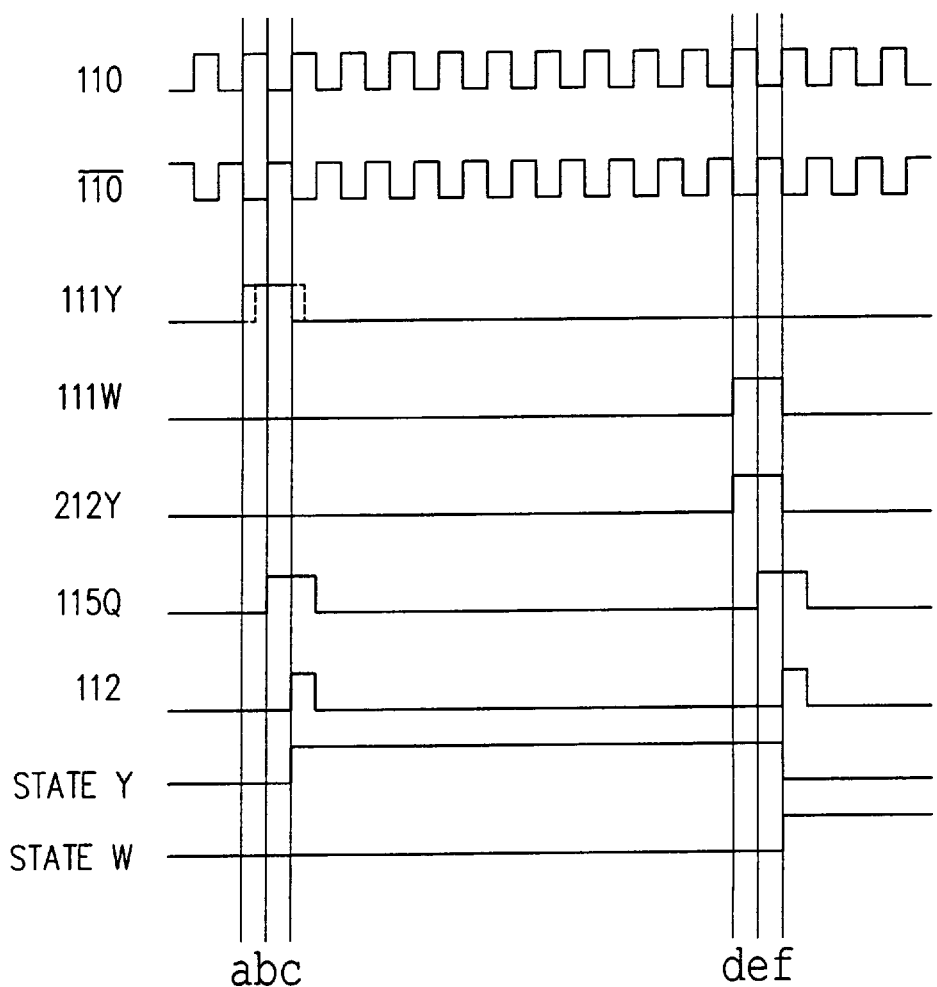
FIG. 6 is an operational waveform chart of the state machine of FIG. 4.

105, 1 appears at the Q output terminal of the D-type F.F. 105 at the time b, which is the next time the reference clock signal 110 falls (the inverted signal thereof rises) after the time a (see the output signal 115Q in FIG. 6). Therefore, in a similar manner to the device of FIG. 1, the synchronization pulse signal 112, which is at "1" for the width of the half-cycle of the reference clock signal 110, appears from the AND gate 103 in synchronization with the reference clock signal 110 at the time c, as shown in FIG. 6.

In this case, to the JK-type F.F. 201-$k$, to which the activated transition condition satisfying signal 111Y is input through the J input terminal (the first input terminal) thereof, the synchronization pulse signal 112 are also input through the C input terminal thereof during the period in which the transition condition satisfying signal 111Y is active, as shown in FIG. 6. Thus a signal that makes the state Y active is output from the Q output terminal of the JK-type F.F. 201-$k$ at the time c shown in FIG. 6.

The synchronization pulse signal 112 does not become active subsequently, so long as no other transition condition satisfying signal such as the signal 111W becomes active, so the Y state is held by the output from the Q output terminal of the D-type F.F. 101-$k$.

Now assume in this case that the transition condition presence signal 111W becomes true at the time d. At this point, a transition condition from the state Y to another state becomes active simultaneously, so the transition condition satisfying signal 212Y becomes active. The transition condition satisfying signal 212Y becoming active causes the generation of the synchronization pulse signal 112 at the time f, by the same operation as that which activated it at the time c. The synchronization pulse signal 112 rises and at the time f so that the transition condition presence signal 111W which has become active is input to the J input terminal of the JK-type F.F. 201-1, which makes the state machine switch to the state W.

At this point, the transition condition satisfying signal 111Y that is being input to the J input terminal of the JK-type F.F. 201-$k$ is non-active and the transition condition satisfying signal 212Y that is being input to the K input terminal (second input terminal) of the JK-type F.F. 201-$k$ is active, which means that the output from the Q output terminal of the JK-type F.F. 201-$k$ becomes "0" and the state Y simultaneously becomes false.

In this manner, effects that are similar to those of the first embodiment can be achieved even when each state holding means is configured of a JK-type F.F.

Third Embodiment

Figure 7:
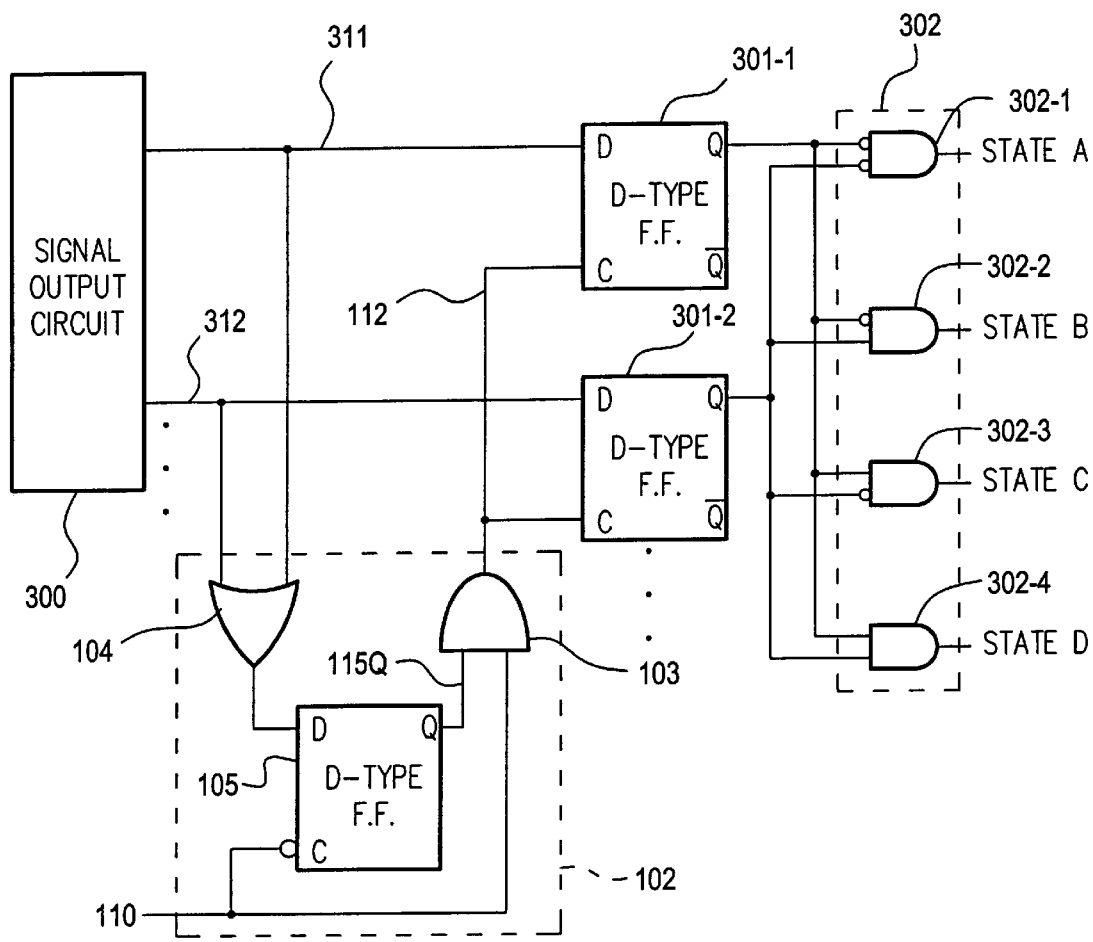
FIG. 7 is a circuit diagram of a third embodiment of a state machine in accordance with the present invention.
Figure 8:
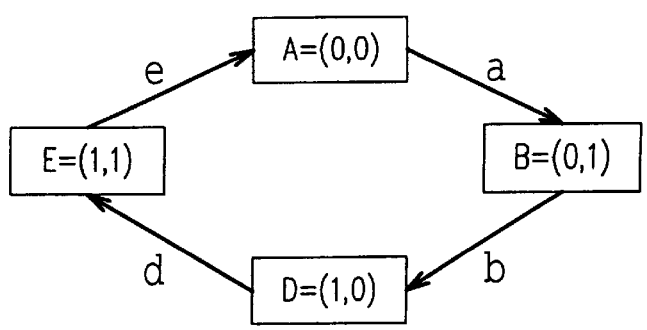
FIG. 8 is a state transition diagram of the state machine of FIG. 7.

A circuit diagram of a state machine in accordance with a third embodiment of the present invention is shown in FIG. 7, with the states obtained by the device of FIG. 7 being shown in FIG. 8.

In the third embodiment, the configuration is such that the operation of k numbers of (where k is two in FIG. 7) flip-flops 301-1 and 301-2 is based on k numbers of (e.g., two) combined transition-condition satisfying signals 311 and 312 from a signal output circuit 300 and the synchronization pulse signal 112 from the synchronization pulse generation circuit 102, and the states thereof are decoded by a decoder 302 in such a manner that a number of states n, which is greater than k (n is four in FIG. 7), can be created therefrom.

Figure 9:
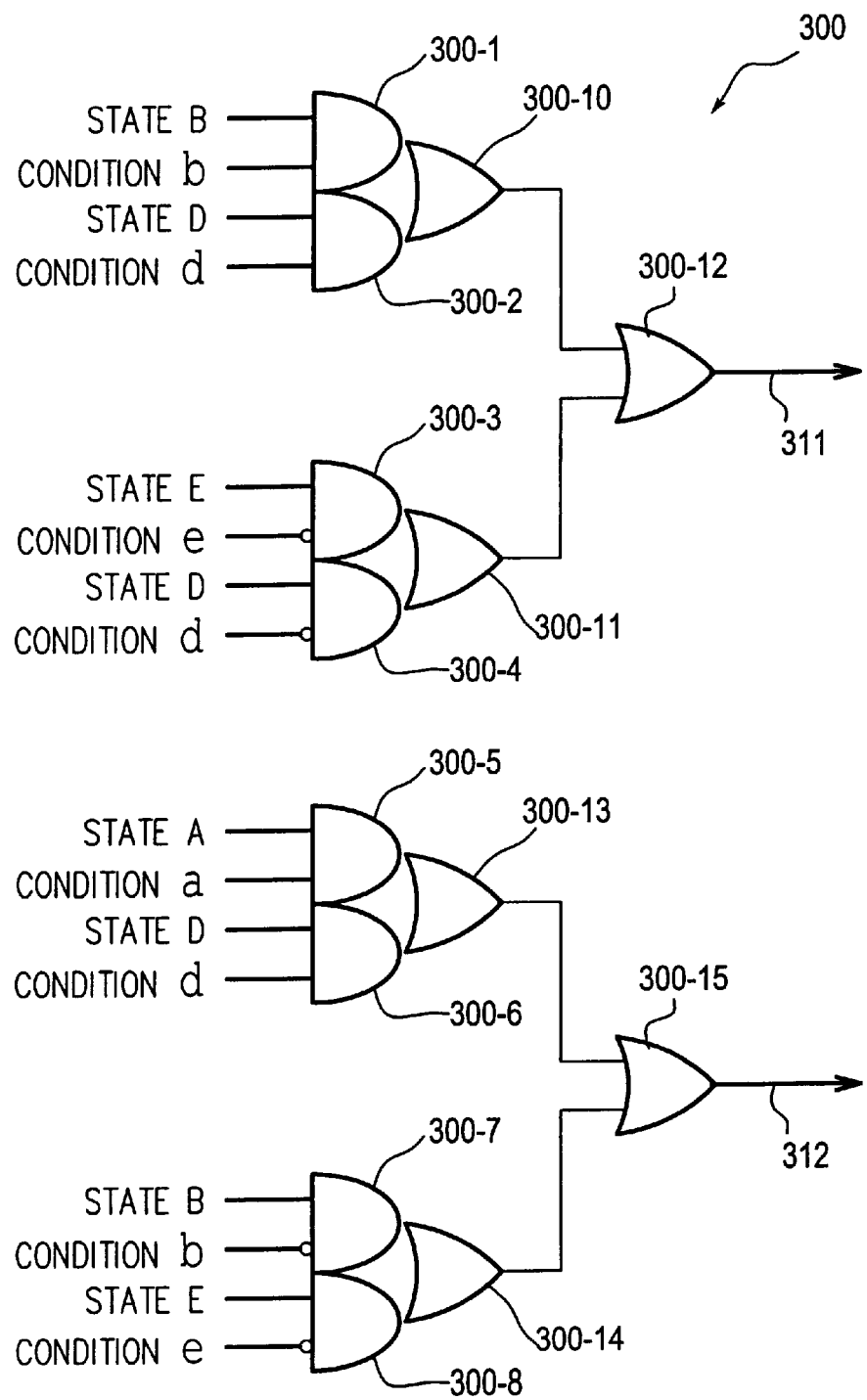
FIG. 9 is a circuit diagram of an example of the signal output circuit of FIG. 7.

The signal output circuit 300 shown in FIG. 7 is configured of eight AND gates 300-1 and 300-8 and six OR gates 300-10 to 300-15, as shown by way of example in FIG. 9.

This signal output circuit 300 makes a combined transition-condition satisfying signal 311 active when both a state B and the condition b are satisfied, when both a state D and the condition d are satisfied, when the state E is satisfied but a condition e is not satisfied, or when the state D is satisfied but the condition d is not satisfied. The signal output circuit 300 also makes another combined transition-condition satisfying signal 312 active when both a state A and the condition a are satisfied, when both the state D and the condition d are satisfied, when the state B is satisfied but the condition b is not satisfied, or when the state E is satisfied but the condition e is not satisfied.

Each of the two D-type F.Fs. 301-1 and 301-2 functions as a register or state code holder means for holding a 2-bit output (state code signal). These 2-bit outputs are a Q output from the D-type F.F. 301-1 and a Q output from the D-type F.F. 301-2. Any one of four states A to D (state signals) are obtained by the decoder 302 decoding these 2-bit outputs.

In this case, if the Q output of the D-type F.F. 301-1 is R0 and the Q output of the D-type F.F. 301-2 is R1, the states A to D are defined as follows:

state A=(R0, R1)=(0, 0)

state B=(R0, R1)=(0, 1)

state C=(R0, R1)=(1, 0)

state C=(R0, R1)=(1, 1)

In this manner, the third embodiment makes it possible to construct a state machine using a number of flip-flops that is smaller than the number of states to be held. Moreover, this third embodiment makes it possible to reduce redundancy by making it unnecessary to have signals for holding the various states, in a similar manner to the first and second embodiments, so that the circuitry is simpler and it is also possible to expect a reduction in the number of debugging and maintenance steps. Note that one of the JK-type flip-flops of the second embodiment can be used instead of the D-type flip-flops in this third embodiment. In such a case, the signal output circuit 300 generates and outputs a combined transition-condition satisfying signal for the J terminal (first input terminal) and another combined transition-condition satisfying signal for the K terminal (second input terminal) respectively.

Regardless of the type of flip-flop used, this third embodiment is similar to the first and second embodiments in that the synchronization pulse signal is generated only when a transition condition is satisfied, and thus the power consumption thereof can be reduced.

Note that, although the outputs from Q output terminals are mentioned as the outputs from the various flip-flops used in the above first to third embodiments, inverted output signals from /Q output terminals thereof could also be used therefor.

Fourth Embodiment

Figure 10:
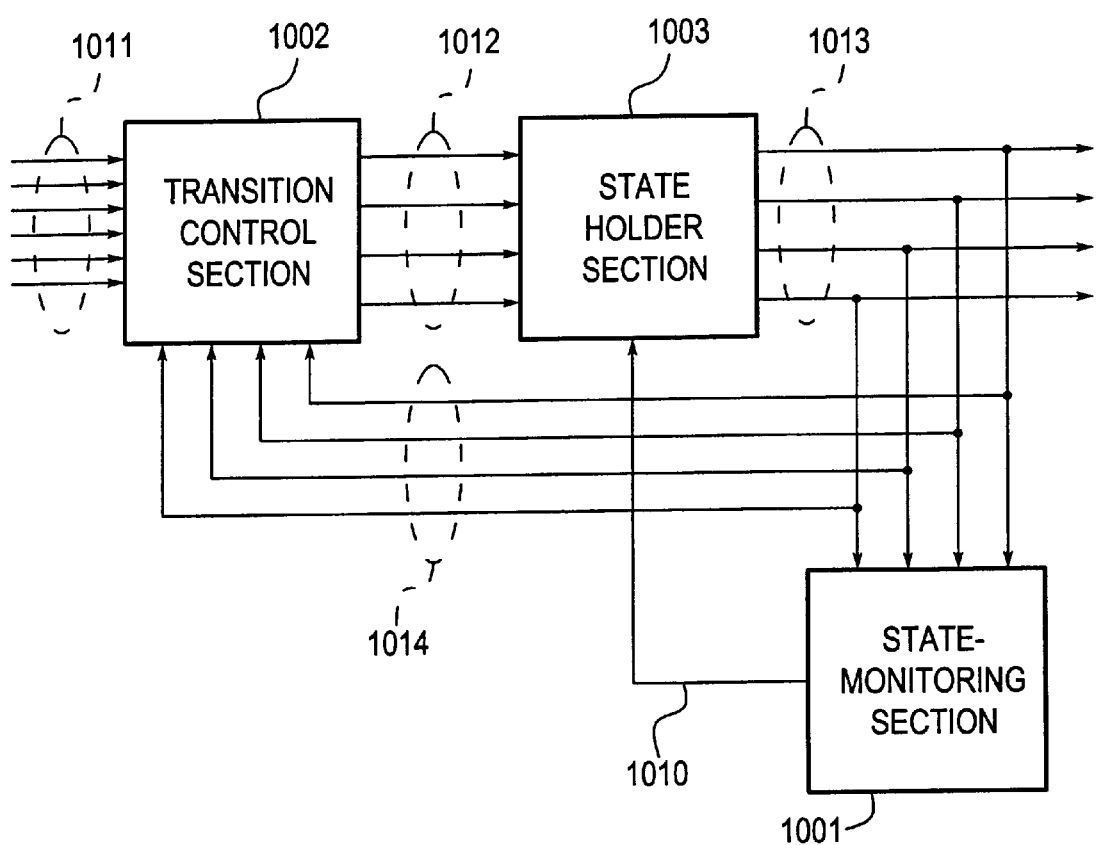
FIG. 10 is a block diagram of a fourth embodiment of a state machine in accordance with the present invention.

A block diagram of a fourth embodiment of the present invention is shown in FIG. 10. This state machine comprises a state-monitoring section 1001, a transition control section 1002, and a state holding section 1003. The transition control section 1002 generates a transition condition satisfying signal 1012 based on an abnormality detection signal 1010 and an input signal 1011. The state holding section 1003 is provided with state holding means and synchronization pulse signal generation means as described in the first to third embodiments, and it holds the transition condition satisfying signal 1012 based on the synchronization pulse signal, then makes any one of n numbers of state signals 1013 active (true) for output.

The state-monitoring section 1001 monitors n numbers of states and is provided with abnormality detection means which determines that it is normal when only one of the n numbers of states is true, but which views any other cases as an abnormality. If an abnormality is detected by the abnormality detection means, the state-monitoring section 1001 outputs the abnormality detection signal 1010 to the state holding section 1003. The state holding section 1003 sets the state machine to a prescribed state other than the abnormal state, for example, resetting the state machine to the state immediately after the power is turned on, in accordance with the abnormality detection signal 1010.

An example of the logic of abnormality detection when there are four states A to D is given by the following equation:

$$AB+AC+AD+BC+BD+CD+\text{not}(A+B+C+D) \tag{1}$$

If Equation 1 is true, this indicates that either none of the states A to D is true or two or more states are true. Assume that the abnormality detection means has detected an abnormality when the abnormality detection logic is true. Note that the logic of abnormality detection is not limited to Equation 1; other logical equivalence can well be used. In this case, Equation 1 refers to a case in which there are four states A to D, but it can also be extended and applied to any number of states n.

By configuring the state machine in this manner, it is possible to detect an abnormal state caused by incorrect operation and return the state machine to its correct state.

Fifth Embodiment

Figure 11:
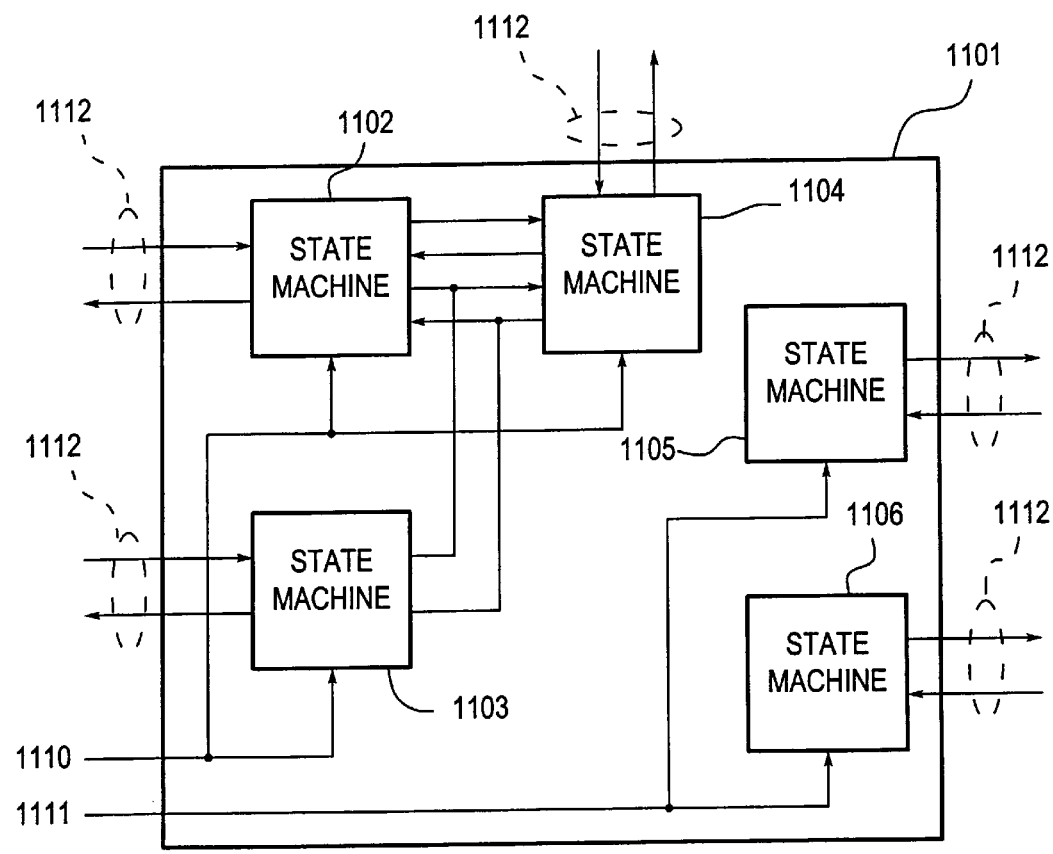
FIG. 11 is a block diagram of a fifth embodiment of a state machine in accordance with the present invention.
Figure 12:
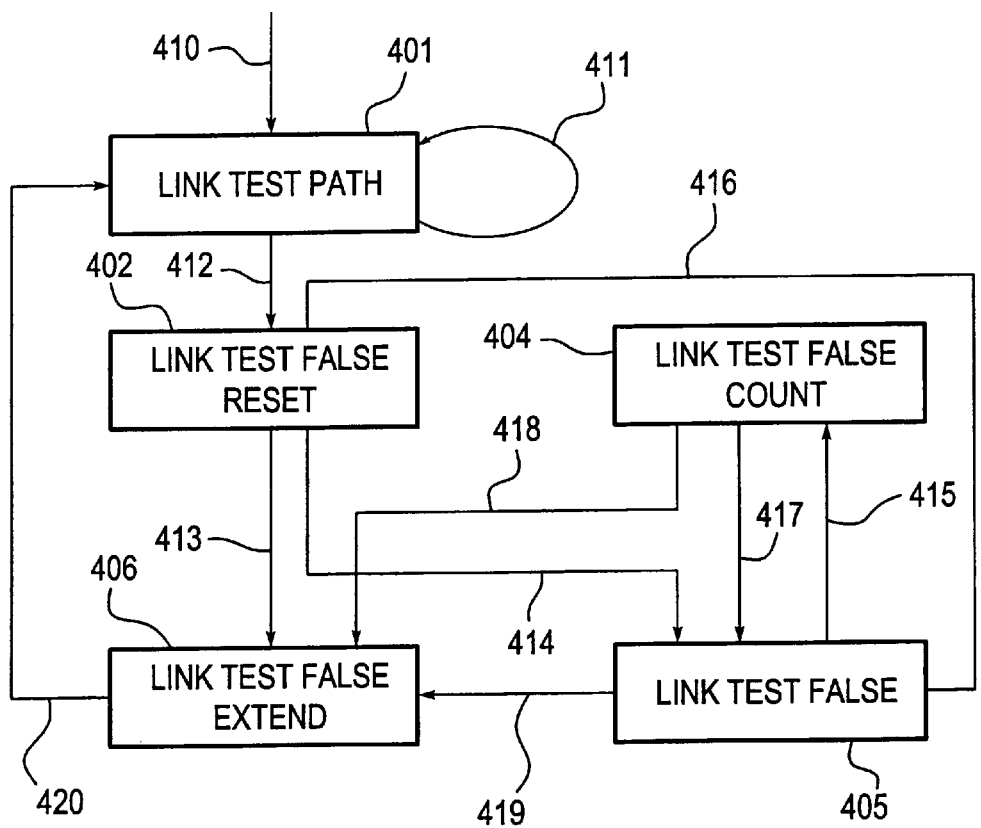
FIG. 12 shows an example of state transitions.

A block diagram of a fifth embodiment of the present invention is shown in FIG. 11. A semiconductor device 1101 in accordance with the fifth embodiment comprises state machines 1102 to 1106. These state machines 1102 to 1106 input and output input-output signals 1112, based on reference clock signals 1110 and 1111. All or some of these state machines 1102 to 1106 have the configuration described above with reference to the first to fourth embodiments.

The state machines 1102 to 1106 operate in synchronization with the reference clock signals 1110 and 1111 and determine the state of a signal within an (m+1)th operating cycle based on the state of the signal within an mth operating cycle.

Since redundancy in the thus configured semiconductor device can be reduced by making it unnecessary to input a holding condition to a flip-flop that is a state holding means in all or some of the state machines, the circuitry is simplified and the effect of reducing the number of debugging and maintenance steps can be achieved. In addition, power consumption in all or some of the state machines can be reduced because the synchronization pulse signal is generated only when a transition condition is satisfied.

A further embodiment of the present invention relates to electronic equipment comprising a semiconductor device. Electronic calculators, by way of example, include a plurality of semiconductor devices as structural requirements, and many sections thereof operate in synchronization with each other. A protocol control device such as a LAN connection device has a semiconductor device comprising a large number of state machines. If the present invention is applied to all or some of the semiconductor devices in such electronic devices, the effects of the present invention within each of the semiconductor devices act in synergy, so that the cumulative effect achieved by the entire electronic device is greater.

What is claimed is:

1. A state machine operating in synchronization with a reference clock signal and holding any one state that shifts between n numbers of states, said state machine comprising:

signal output means for activasting and outputting any one of n numbers of transition condition satisfying signals, every time a condition for transition to any of said n numbers of states is satisfied;

n numbers of state holding means provided in correspondence to said n numbers of states, for outputting n numbers of state signals representing the corresponding n numbers of states, any one of said n numbers of state signals being activated so as to hold one of said n numbers of states; and synchronization pulse signal generation means for generating a one-shot synchronization pulse signal which synchronizes with said reference clock signal, when said condition for transition to any one of said states is satisfied, wherein said one-shot synchronization pulse signal is input in common to all of said n numbers of state holding means, and any one of said state holding means corresponding to any one said states for which a transition condition is satisfied makes corresponding one of said state signals active, during a period from the satisfaction of said condition for transition to one of said states until the satisfaction of a condition for transition to another one of said states.

2. The state machine as defined in claim 1, wherein:

said n numbers of state holding means are configured of first to nth D-type flip-flops;

said n numbers of transition condition satisfying signals are input to data input terminals of said corresponding first to nth D-type flip-flops;

said synchronization pulse signal generated by said synchronization pulse signal generation means is input to clock input terminals of said first to nth D-type flip-flops; and first to nth state signals are output from data output terminals of said corresponding first to nth D-type flip-flops.

3. The state machine as defined in claim 1, wherein:

said n numbers of state holding means are configured of first to nth JK-type flip-flops;

said n numbers of transition condition satisfying signals are input to data input terminals of said corresponding first to nth JK-type flip-flops;

signals any one of which is made active by satisfying a condition for transition to another state from any one of said first to nth states are input to second input terminals of said first to nth JK-type flip-flops;

said synchronization pulse signal generated by said synchronization pulse signal generation means is input to clock input terminals of said first to nth JK-type flip-flops; and first to nth state signals are output from data output terminals of said corresponding first to nth JK-type flip-flops.

4. The state machine as defined in claim 1, wherein:

said synchronization pulse signal generating means comprises a D-type flip-flop and an AND circuit;

a signal that is made active by satisfying a condition for transition to any of said n numbers of states is input to a data input terminal of said D-type flip-flop;

an inverted signal of said reference clock signal is input to a clock input terminal of said D-type flip-flop; and a Q output of said D-type flip-flop and said reference clock signal are input to said AND circuit.

5. The state machine as defined in claim 1, further comprising:

state-monitoring means for detecting an abnormality by monitoring said n numbers of states and detecting an abnormality that is indicated by at least two states being true.

6. The state machine as defined in claim 5, wherein:

after detecting an abnormality, said state-monitoring means resets said abnormal state and sets the state machine to a normal state.

7. The state machine as defined in claim 6, wherein:

after detecting an abnormality, said state-monitoring means resets said abnormal state and sets the state machine to an initial state.

8. A state machine operating in synchronization with a reference clock signal and holding any one state that shifts between n numbers of states, said state machine comprising;

signal output means for outputting k numbers of (where k<n) first to kth combined transition-condition satisfying signals corresponding to said n number of states, every time there is a change in conditions for transition to any of said n numbers of states;

synchronization pulse signal generation means for generating a one-shot synchronization pulse signal which synchronizes with said reference clock signal when said condition for transition to one of said states is satisfied;

k numbers of state code holder means for outputting first to kth state code signals corresponding to said first to kth combined transition-condition satisfying signals, based on said first to kth combined transition-condition satisfying signals and said one-shot synchronization pulse signal; and decoding means for decoding said first to kth state code signals that are output from said k numbers of state code holder means and generating n numbers of state signals corresponding in a one-to-one manner to said n numbers of states.

9. The state machine as defined in claim 8, wherein:

said k numbers of state code holder means are configured of first to kth D-type flip-flops;

said first to kth combined transition-condition satisfying signals are input to data input terminals of said corresponding first to kth D-type flip-flops;

said synchronization pulse signal generated by said synchronization pulse signal generation means is input to clock input terminals of said first to kth D-type flip-flops; and said first to kth state code signals are output from data output terminals of said corresponding first to kth D-type flip-flops.

10. The state machine as defined in claim 8, wherein:

said k numbers of state code holding means are configured of first to kth JK-type flip-flops;

said first to kth combined transition-condition satisfying signals are input respectively to a first input terminal and a second input terminal of the corresponding first to kth JK-type flip-flops;

said synchronization pulse signal generated by said synchronization pulse signal generation means is input to clock input terminals of said first to kth JK-type flip-flops; and said first to kth state code signals are output from data output terminals of said corresponding first to kth JK-type flip-flops.

11. The state machine as defined in claim 8, wherein:

said synchronization pulse signal generating means comprises a D-type flip-flop and an AND circuit;

a signal that is made active by any of said first to kth combined transition-condition satisfying signals is input to a data input terminal of said D-type flip-flop;

an inverted signal of said reference clock signal is input to a clock input terminal of said D-type flip-flop; and a data output of said D-type flip-flop and said reference clock signal are input to said AND circuit.

12. The state machine as defined in claim 8, further comprising:

state-monitoring means for detecting an abnormality by monitoring said n numbers of states and detecting an abnormality that is indicated by at least two states being true.

13. The state machine as defined in claim 12, wherein:

after detecting an abnormality, said state-monitoring means resets said abnormal state and sets the state machine to a prescribed state other than said abnormal state.

14. The state machine as defined in claim 13, wherein:

said state-monitoring means resets said abnormal state and sets the state machine to an initial state.

15. A semiconductor device operating in synchronization with a reference clock signal, such that a state of a signal in an (m+1)th operating cycle is determined based on a state of a signal within an mth operating cycle, wherein said semiconductor device comprises n numbers of state machines, and at least one state machine is configured of the state machine as defined in claim 1.

16. Electronic equipment comprising the semiconductor device defined in claim 15.

* * * * *